(12) United States Patent
Li et al.

(10) Patent No.: US 11,614,504 B2
(45) Date of Patent: Mar. 28, 2023

(54) COMMAND PROVISION VIA MAGNETIC FIELD VARIATION

(71) Applicant: Lenovo (Singapore) Pte. Ltd., Singapore (SG)

(72) Inventors: Scott Wentao Li, Cary, NC (US); Robert James Kapinos, Durham, NC (US); Russell Speight VanBlon, Raleigh, NC (US); Robert James Norton, Jr., Raleigh, NC (US)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 277 days.

(21) Appl. No.: 16/993,722

(22) Filed: Aug. 14, 2020

(65) Prior Publication Data

US 2022/0050149 A1 Feb. 17, 2022

(51) Int. Cl.
*G01R 33/07* (2006.01)
*G01R 33/00* (2006.01)
*G01D 5/14* (2006.01)

(52) U.S. Cl.
CPC .......... *G01R 33/072* (2013.01); *G01D 5/147* (2013.01); *G01R 33/0023* (2013.01)

(58) Field of Classification Search
CPC ... G06F 3/017; A45C 11/00; A45C 2011/003; A45C 2011/002; H03K 17/97; H03K 17/9517; H03K 2217/9651; G01R 33/072; G01R 33/0023; G01R 33/07; G01D 5/147; G01D 5/145
See application file for complete search history.

(56) References Cited

U.S. PATENT DOCUMENTS

| | | | |
|---|---|---|---|
| 2015/0220770 A1 * | 8/2015 | Davis | G07C 9/257 340/5.83 |
| 2017/0285768 A1 * | 10/2017 | Bruwer | G01D 5/2013 |

* cited by examiner

*Primary Examiner* — Lee E Rodak
*Assistant Examiner* — Brent J Andrews
(74) *Attorney, Agent, or Firm* — Ference & Associates LLC

(57) ABSTRACT

One embodiment provides a method, including: detecting, using a sensor of an information handling device, a change in a magnetic field associated with the information handling device; determining, using a processor, whether the change in the magnetic field corresponds to a known command; and performing, responsive to determining that the change in the magnetic field corresponds to the known command, a function dictated by the known command. Other aspects are described and claimed.

15 Claims, 4 Drawing Sheets

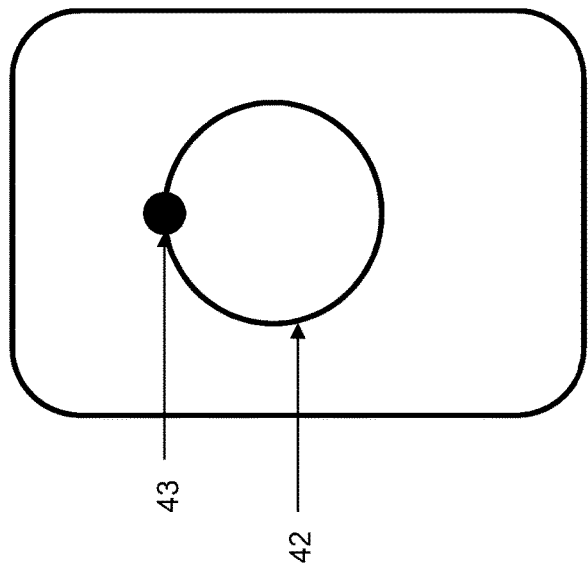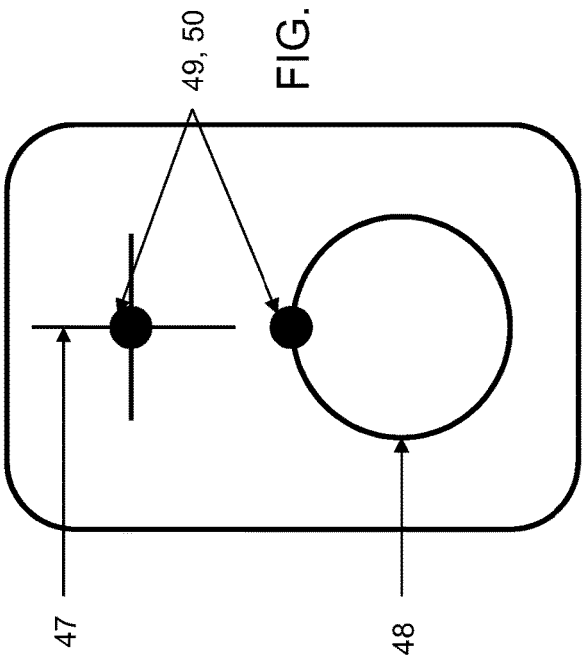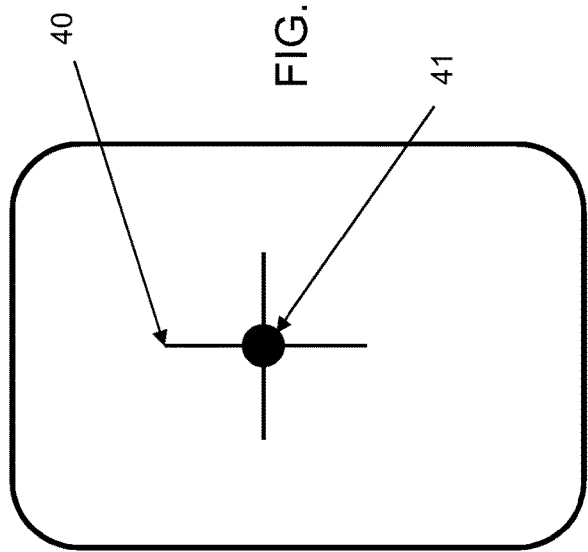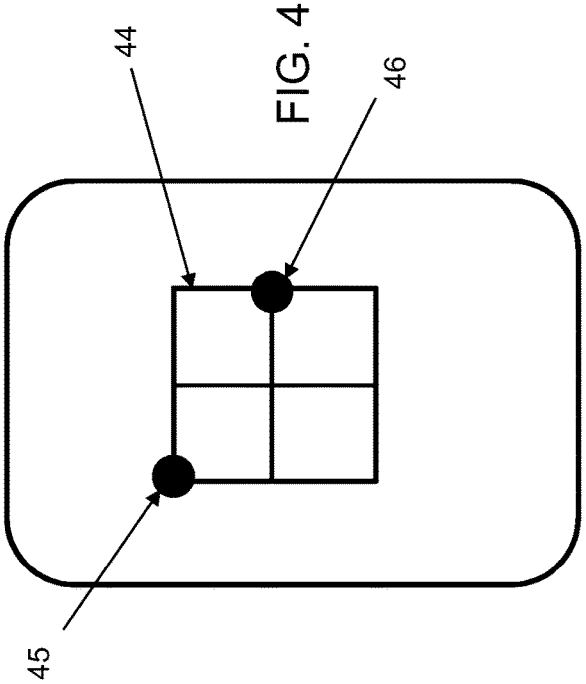

COMMAND PROVISION VIA MAGNETIC FIELD VARIATION

BACKGROUND

Users frequently interact with their information handling devices ("devices"), for example, smart phones, tablets, handheld gaming devices, and the like, to accomplish a variety of different tasks. It is common for users to place their device in a case, which may not only help protect the device from damage but may also help the user hold and secure their device while they are interacting with it.

BRIEF SUMMARY

In summary, one aspect provides a method, comprising: detecting, using a sensor of an information handling device, a change in a magnetic field associated with the information handling device; determining, using a processor, whether the change in the magnetic field corresponds to a known command; and performing, responsive to determining that the change in the magnetic field corresponds to the known command, a function dictated by the known command.

Another aspect provides an information handling device, comprising: a sensor; a processor; a memory device that stores instructions executable by the processor to: detect a change in a magnetic field associated with the information handling device; determine whether the change in the magnetic field corresponds to a known command; and perform, responsive to determining that the change in the magnetic field corresponds to the known command, a function dictated by the known command.

A further aspect provides a product, comprising: a storage device that stores code, the code being executable by a processor and comprising: code that receives an indication to pair an accessory device with an information handling device; code that adjusts, responsive to the receiving, a transmitting power of the accessory device; and code that pairs, based on the adjusting, the accessory device to the information handling device.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE SEVERAL VIEWS OF THE DRAWINGS

FIGS. 4(A-D) illustrate a plurality of track configurations according to various embodiments.

DETAILED DESCRIPTION

Figure 1:
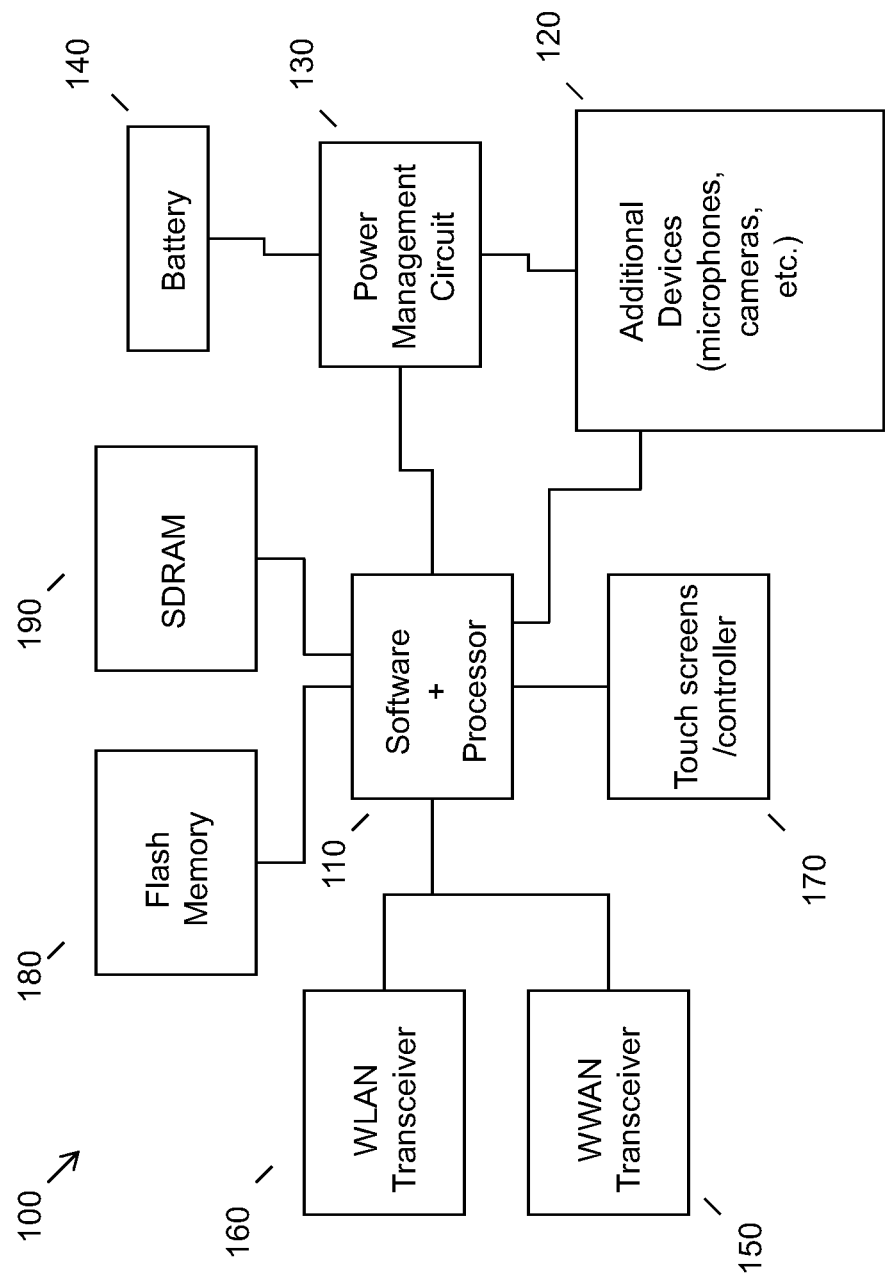
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Although device cases provide a variety of benefits (e.g., damage protection, etc.), they may sometimes hinder a user's ability to effectively interact with their device. For example, "folding wallet" style cases, in which a user's device is secured between two flaps of the case, may prevent a user from quickly accessing the contents of their device and/or from providing complex inputs to their device. More particularly, although a user may be able to have some minimal control over device functionality (e.g., the device case may have cut outs to allow a user to adjust the volume of their device without opening the case flap, etc.), they would need to perform one or more maneuvers to actually access their devices' primary input medium (e.g., touch screen, physical keyboard, keypad, etc.). Additionally, once such a case is opened it may be awkward to hold, which may also negatively affect a user's ability to provide accurate and intended inputs.

Accordingly, an embodiment provides a method for allowing users to provide user inputs to a device by manipulating a magnetic field associated with the device. In an embodiment, a sensor of a device may detect a change to the devices' magnetic field. The change may be facilitated by a user's interaction with a magnet attached to a device case. More particularly, the magnet may be attached to a track positioned on a rear surface of the device and a user's interactions with the magnet (e.g., by sliding the magnet around the track with their finger(s), etc.) may influence changes to the devices' magnetic field. An embodiment may then determine whether the detected changes to the magnetic field correspond to changes that are known by the device to be associated with certain command inputs. Responsive to making a positive determination, an embodiment may thereafter perform a function that is dictated by the command input(s). Such a method may enable a user to effectively provide inputs to the device while their device is secured in a case.

The illustrated example embodiments will be best understood by reference to the figures. The following description is intended only by way of example, and simply illustrates certain example embodiments.

While various other circuits, circuitry or components may be utilized in information handling devices, with regard to smart phone and/or tablet circuitry 100, an example illustrated in FIG. 1 includes a system on a chip design found for example in tablet or other mobile computing platforms. Software and processor(s) are combined in a single chip 110. Processors comprise internal arithmetic units, registers, cache memory, busses, I/O ports, etc., as is well known in the art. Internal busses and the like depend on different vendors, but essentially all the peripheral devices (120) may attach to a single chip 110. The circuitry 100 combines the processor, memory control, and I/O controller hub all into a single chip 110. Also, systems 100 of this type do not typically use SATA or PCI or LPC. Common interfaces, for example, include SDIO and I2C.

There are power management chip(s) 130, e.g., a battery management unit, BMU, which manage power as supplied, for example, via a rechargeable battery 140, which may be recharged by a connection to a power source (not shown). In at least one design, a single chip, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additionally, devices 120 are commonly included, e.g., an image sensor such as a camera, audio capture device such as a microphone, etc. System 100 often includes one or more touch screens 170 for data input and display/rendering. System 100 also typically includes various memory devices, for example flash memory 180 and SDRAM 190.

Figure 2:
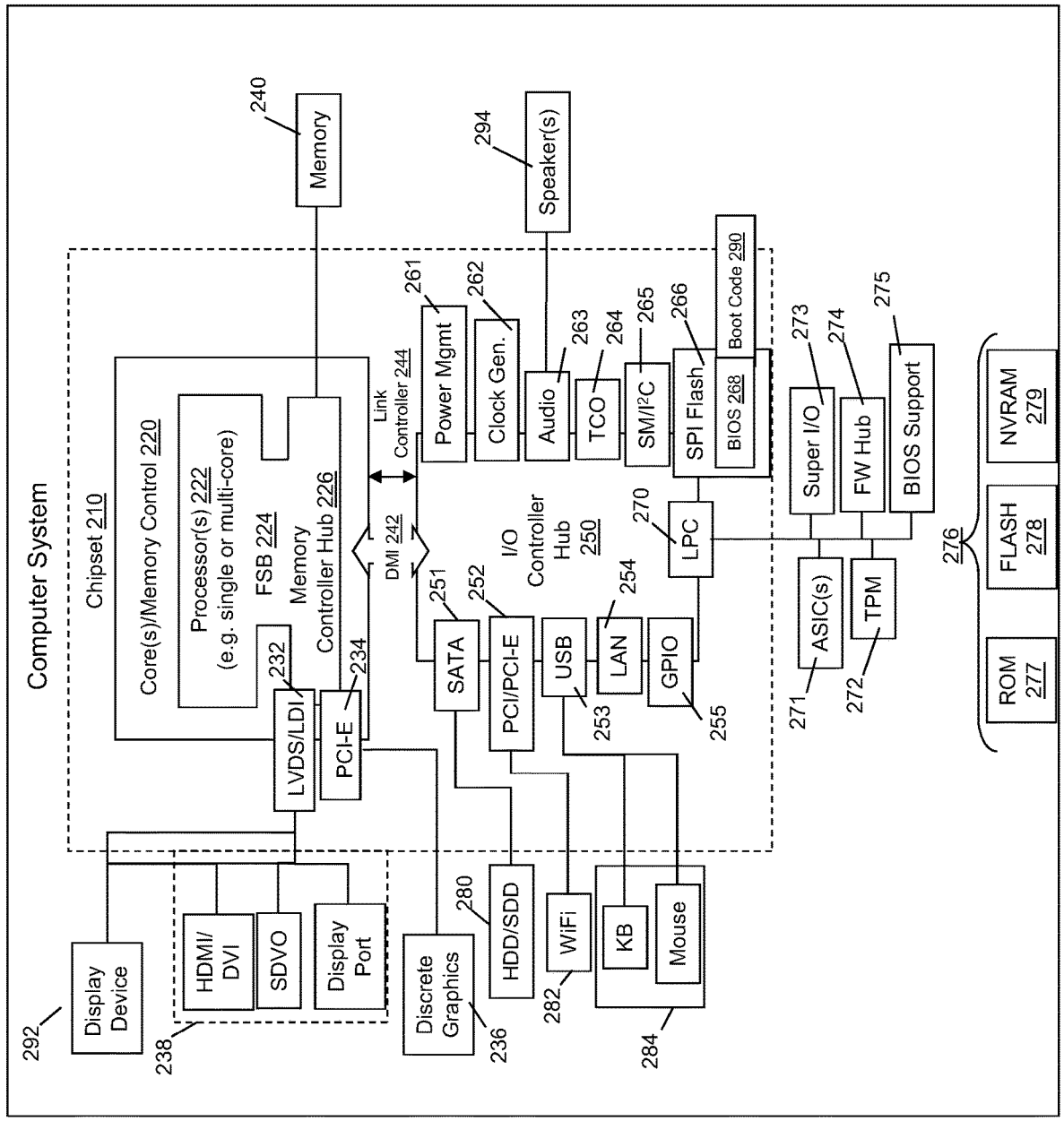
FIG. 2 illustrates another example of information handling device circuitry.

FIG. 2 depicts a block diagram of another example of information handling device circuits, circuitry or components. The example depicted in FIG. 2 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling circuitry, as for example outlined in FIG. 1 or FIG. 2, may be used in devices that emit a magnetic field and that may be secured to a case. For example, the circuitry outlined in FIG. 1 may be implemented in a smart phone or tablet embodiment, whereas the circuitry outlined in FIG. 2 may be implemented in a laptop.

Figure 3:
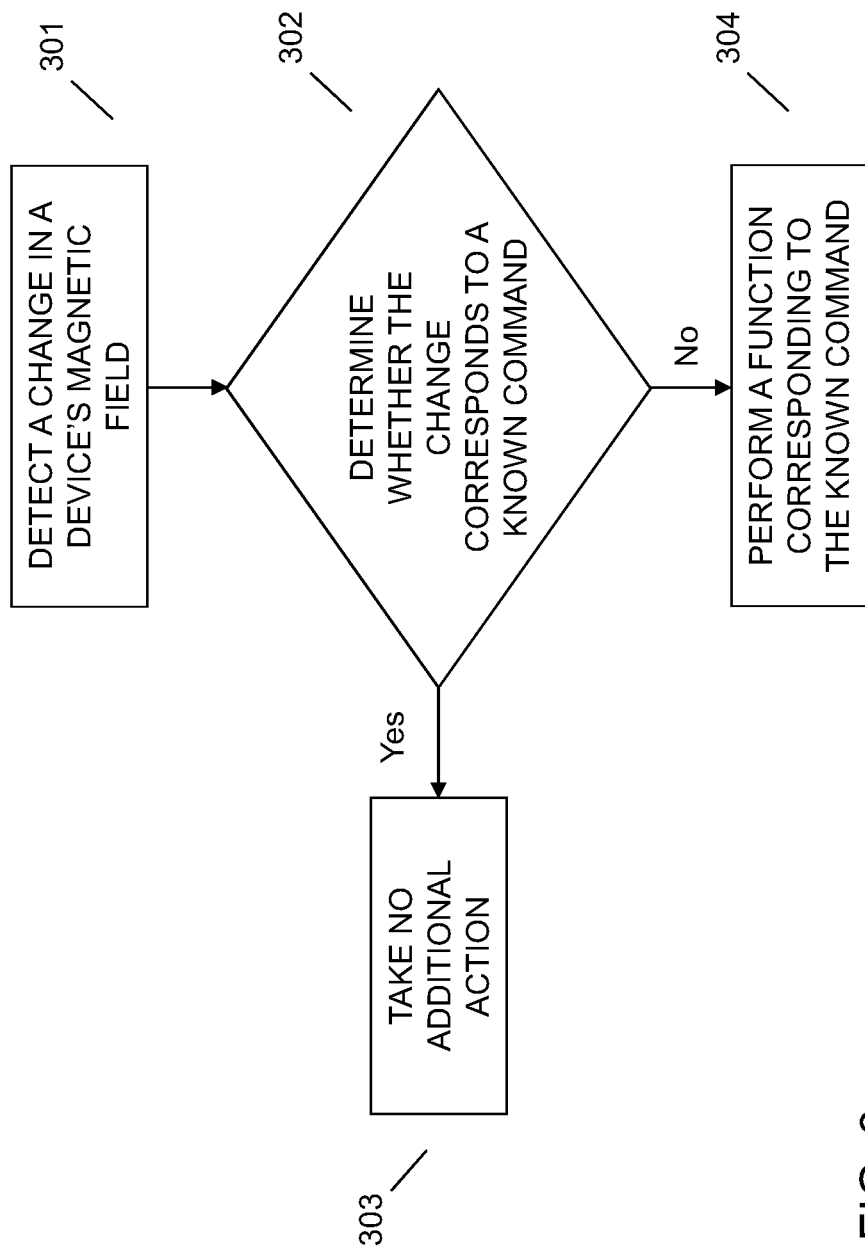
FIG. 3 illustrates an example method of providing a command to a device by manipulating a magnetic field associated with the device.

Referring now to FIG. 3, an embodiment provides a method for providing command inputs to a device by manipulating a magnetic field associated with the device. At 301, an embodiment may detect a change in a device's magnetic field. In an embodiment, the change may be detected by an integrated magnetic field variation sensor (e.g., Hall effect sensor, etc.), which is sensitive to minute changes in the magnetic field near the device.

In an embodiment, the changes to the magnetic field may result from the movement of a magnet within a predetermined range of the device. More particularly, the device may be secured in a case (e.g., a folding wallet style case, etc.) and the magnet may be attachable to a magnet assembly on the surface of the case. Although the embodiments described herein may be usable with virtually any type of case style, for simplicity purposes the remainder of this discussion will be facilitated with reference to a folding wallet style case. Additionally, although the track may be located on virtually any surface of the case (e.g., a front outer surface, a rear outer surface, etc.), for simplicity purposes the remainder of this discussion will refer to a track that is positioned on a rear outer surface of the case (i.e., a surface of the case that is opposite from the surface in which the device is placed and/or secured).

In an embodiment, the magnet assembly may consist of a track on which at least one magnet may be placed. The track may be composed of one or more magnetic materials (e.g., iron, nickel, cobalt, etc.) that the magnet(s) may be attracted to. In this situation, a magnet may be placed directly on the track where it may be secured via an attractive force (i.e., between itself and the track). Alternatively, the magnet may be placed on and/or secured by a magnet securing object, which itself may be directly attached to the track and that may be movable along the track.

In an embodiment, the track may take the form of a predetermined shape (e.g., a circle, a square, a crosshair, a grid, etc.). As more fully described herein, the shape of the track may influence the commands that are able to be provided to the device. Furthermore, other embodiments may exist where a case may contain two or more tracks that each may be configured to secure their own magnet. Depending upon a user's interaction context (e.g., the application they are interacting with, the type of inputs they intend to provide to the device, their physical ability to hold the device, etc.), certain track shapes and/or track numbers may be more beneficial than others. Additionally, the track(s) may be integrated into the case or, alternatively, may be removable and replaced with other tracks of a different shape. In this regard, it's possible that a case may contain at least two tracks where each of the tracks has a shape that is different than the other.

Referring now to FIGS. 4(A-D), non-limiting examples of track configurations are presented. In each of these configurations, the track is located on a surface of a case (i.e., a rear outer surface) and has a particular shape. Additionally, at least one magnet may be positioned on and secured to each of the tracks. The magnet may be movable by a user (e.g., with their finger, etc.) along a length of the track. The movement of the magnet may correspondingly produce a change in a magnetic field associated with the device. This change may be registered by the device and may provide an indication to the device to perform a function that corresponds to the movement, as further described herein.

Focusing on FIG. 4A, a track 40 is presented that has a crosshair shape. A user may move the magnet 41 all along the crosshair track (e.g., up, down, left, right, etc.). A similar input methodology may be applicable to the track 42 in FIG. 4B, which is a circle shape. More particularly, a user may move the magnet 43 in a circular motion along the track 42. Turning to FIG. 4C, a squared grid track 44 is illustrated that contains two magnets 45, 46. A user may interact with either magnet 45, 46 individually or provide movements to both magnets 45, 46 substantially simultaneously. Turning to FIG. 4D, a case is illustrated that contains two sets of tracks, i.e., a crosshair track 47 and a circular track 48. A magnet 49, 50 may be placed on each of these tracks that a user can interact with. More particularly, a user may interact with only one magnet on one track or, alternatively, may provide movements to both magnets substantially simultaneously. Additionally, the two tracks may be the same shape or may each be a unique shape.

At 302, an embodiment may determine whether the change in the magnetic field corresponds to a known command. In an embodiment, this determination may be facilitated by comparing the characteristics of the change to the magnetic field (e.g., location of change, intensity of change, pattern of change, a combination thereof, etc.) to a database (e.g., stored locally on the device, stored remotely on another device or server, etc.) that contains correlations between magnetic field change characteristics and known input commands. If the information is available to the device, an embodiment may additionally consider the shape of the track, the number of magnets being used to provide inputs, the number of tracks resident on the case, etc., during the determination process.

On the user's end, provision of a desired command may be implemented by moving the magnet in a predetermined pattern as dictated by the shape of the track. For example, referring back to FIG. 4A, if a magnet is originally positioned at the right most end of the crosshair, a user may slide the magnet left (to the center of the crosshair) and then up (to the top most end of the crosshair) in order to provide a desired command. In an embodiment, a function corresponding to the command may vary depending upon an application being interacted with. For example, the command described above may be interpreted as a "delete paragraph" command if the user is in a word processing application but may also be interpreted as a "jump" command if the user is engaged in a video game.

Referring to FIG. 4C, a user may provide command inputs by moving the two magnets on the track substantially simultaneously. In an embodiment, the dual movement of these magnets may provide an indication to the system to perform a function that could otherwise not be performed by movement of a single magnet. For example, to perform a zoom in or zoom out function on the device, a user may move both magnets toward each other to facilitate performance of the former and may move both magnets away from each other to facilitate performance of the latter. Additionally or alternatively, movement of one magnet in one portion of the track could affect a particular function on the device and movement of the other magnet on another portion of the track could affect another function on the device. For example, a user may move one magnet to adjust a sound setting on the device and may also move another magnet to adjust a brightness level on the device.

Referring to FIG. 4D, a case may contain two or more tracks that a user may interact with. Situations in which the latter may be advantageous are when a user is interacting with a video game, media creation software, etc., and may need finer control of the magnet on each track to accomplish their desired objectives. Additionally, a user may have need for different shaped tracks so that they can effectively interact with multiple applications without constantly having to switch out the tracks on the case. For example, a user may frequently interact with a word processing application, which they find works best with a crosshair track, and may also frequently interact with a music playing application, which they find works best with a circular track.

Responsive to determining, at 302, that the change in the magnetic field does not correspond to a known command, an embodiment may, at 303, take no additional action. Conversely, responsive to determining, at 302, that the change in the magnetic field does correspond to a known command, an embodiment may, at 304, perform a function that is dictated by the known command. More particularly, upon identifying a known command to be performed, an embodiment may access a data store that contains correlations between user commands and corresponding functions and thereafter execute the relevant function.

The various embodiments described herein thus represent a technical improvement to conventional methods of providing input to a device. Using the foregoing techniques, an embodiment may detect a change to the magnetic field produced by the device. This change may be facilitated by movement of a magnet on a track that is attached to a case securing the device. An embodiment may then determine whether the change to the magnetic field corresponds to a known command and, responsive to determining that it does, an embodiment may perform a function that corresponds to the known command. Such a method may enable users to more easily provide commands to their devices while the devices are secured in a case.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device that are executed by a processor. A storage device may be, for example, a system, apparatus, or device (e.g., an electronic, magnetic, optical, electromagnetic, infrared, or semiconductor system, apparatus, or device) or any suitable combination of the foregoing. More specific examples of a storage device/medium include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A method, comprising:
   detecting, using a sensor of a handheld information handling device comprising a display and housed within an information handling device case, a movement, by a user, of a magnet attached to a track having a predetermined shape, the track being attached to the information handling device case, wherein detecting the movement comprises detecting a change, caused by the movement of the magnet, in a magnetic field near the information handling device, wherein the movement corresponds to a predetermined pattern for providing a desired command to the handheld information handling device;
   determining, using a processor, the change in the magnetic field corresponds to a known command for the handheld information handling device, wherein the determining comprises comparing characteristics of the change caused by the movement of the magnet along the track to change characteristics of a plurality of known input commands and identifying a match between the characteristics of the change and one of the plurality of known input commands; and
   performing, responsive to determining that the change in the magnetic field corresponds to the known command, a function dictated by the matching one of the plurality of known input commands.

2. The method of claim 1, wherein the sensor is a Hall effect sensor.

3. The method of claim 1, wherein the track is positioned on a rear surface of the information handling device case that is opposite from a front surface of the information handling device case, wherein the front surface supports the information handling device.

4. The method of claim 1, wherein the predetermined shape influences a pool of available commands.

5. The method of claim 1, wherein the track is removable from the case.

6. The method of claim 1, wherein the determining comprises determining whether the change in the magnetic field corresponds to a predetermined change pattern.

7. An information handling device, comprising:
   a display;
   an information handling device case housing the information handling device;
   a sensor;
   a processor;
   a memory device that stores instructions executable by the processor to:
   detect, using the sensor, a movement, by a user, of a magnet attached to a track having a predetermined shape, the track being attached to the information handling device case, wherein detecting the movement comprises detecting a change, caused by the movement of the magnet, in a magnetic field near the information handling device, wherein the information handling device comprises a handheld information handling device, wherein the movement corresponds to a predetermined pattern for providing a desired command to the handheld information handling device;

determine the change in the magnetic field corresponds to a known command for the handheld information handling device, wherein the determining comprises comparing characteristics of the change caused by the movement of the magnet along the track to change characteristics of a plurality of known input commands and identifying a match between the characteristics of the change and one of the plurality of known input commands; and perform, responsive to determining that the change in the magnetic field corresponds to the known command, a function dictated by the matching one of the plurality of known input commands.

8. The information handling device of claim 7, wherein the sensor is a Hall effect sensor.

9. The information handling device of claim 7, wherein the track is positioned on a rear surface of the information handling device case that is opposite from a front surface of the information handling device case, wherein the front surface supports the information handling device.

10. The information handling device of claim 7, wherein the predetermined shape influences a pool of available commands.

11. The information handling device of claim 7, wherein the track is removable from the case.

12. The information handling device of claim 7, wherein the instructions executable by the processor to determine comprise instructions executable by the processor to determine whether the change in the magnetic field corresponds to a predetermined change pattern.

13. An information handling device case, comprising:
a track having a predetermined shape; and
a magnet attached to the track, wherein the magnet is movable along the track, wherein movement of the magnet, by a user and along the track in a predetermined pattern for providing a desired command to a handheld information handling device comprising a display and housed within the information handling device case causes a change in a magnetic field near the information handling device and wherein the change in the magnetic field causes the information handling device to perform a function by comparing characteristics of the change caused by the movement of the magnet along the track to change characteristics of a plurality of known input commands and identifying a match between the characteristics of the change and one of the plurality of known input commands and performing a function dictated by the matching one of the plurality of known input commands;
wherein the information handling device case is attachable to the information handling device.

14. The information handling device case of claim 13, wherein the track is positioned on a rear surface of the information handling device case that is opposite from a front surface of the information handling device case, wherein the front surface supports the information handling device.

15. The information handling device case of claim 13, wherein the track is removable from the information handling device case.

* * * * *